(12) United States Patent
Tejada

(10) Patent No.: US 8,400,862 B2
(45) Date of Patent: Mar. 19, 2013

(54) WAKE-UP CONTROL CIRCUIT FOR POWER-GATED IC

(75) Inventor: Jose Tejada, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 239 days.

(21) Appl. No.: 12/900,840

(22) Filed: Oct. 8, 2010

(65) Prior Publication Data

US 2012/0087199 A1  Apr. 12, 2012

(51) Int. Cl.
  *G11C 5/14* (2006.01)
(52) U.S. Cl. ............... 365/227; 365/226; 365/229
(58) Field of Classification Search .......... 327/544
  See application file for complete search history.

(56) References Cited

U.S. PATENT DOCUMENTS

| | | | |
|---|---|---|---|
| 4,858,196 A * | 8/1989 | Hein | 365/229 |
| 5,519,264 A | 5/1996 | Heyden et al. | |
| 5,805,401 A | 9/1998 | Schuellein et al. | |
| 5,835,440 A * | 11/1998 | Manning | 365/230.06 |
| 6,836,179 B2 * | 12/2004 | Mizuno et al. | 327/544 |
| 7,053,692 B2 | 5/2006 | Parris et al. | |
| 7,180,363 B2 | 2/2007 | Parris et al. | |
| 7,723,979 B2 | 5/2010 | Ashburn, Jr. et al. | |
| 7,791,406 B1 | 9/2010 | Wang et al. | |
| 8,223,577 B2 * | 7/2012 | Akiba et al. | 365/226 |
| 2004/0158749 A1 | 8/2004 | Ruan et al. | |
| 2006/0161792 A1 | 7/2006 | Paul et al. | |
| 2009/0033394 A1 | 2/2009 | Frederick, Jr. et al. | |
| 2009/0089605 A1 | 4/2009 | Westwick et al. | |

OTHER PUBLICATIONS

"Chapter 9: Power Management", Linear Circuit Design Handbook, Edited by Hank Zumbahlen, Newnes, Feb. 2008.
International Search Report and Written Opinion dated Feb. 2, 2012, from counterpart international application No. PCT/US2011/055131.

* cited by examiner

*Primary Examiner* — Tan T. Nguyen
(74) *Attorney, Agent, or Firm* — Kenyon & Kenyon LLP

(57) ABSTRACT

Embodiments of the present invention may provide a power-gating switch circuit. The power-gating switch circuit may comprise a first switch to connect a power supply to a virtual power supply and a second switch to connect the power supply to the virtual power supply in parallel to the first switch. The first switch may have a higher impedance than the second switch. When a wake up signal is received, the first switch may be turned on first and the second switch may be turned on after the virtual power supply reaches a predetermined voltage level.

29 Claims, 6 Drawing Sheets

_US 8,400,862 B2_

WAKE-UP CONTROL CIRCUIT FOR POWER-GATED IC

FIELD OF INVENTION

The present invention relates to power-gating in integrated circuits, and more particularly to a power-gating method and apparatus that uses an external switch circuit with multiple paths for wake up control.

BACKGROUND

Power-gating is a technique to save power in digital circuits. It consists of cutting off the supply voltage to most of the digital components of an integrated circuit (IC) during periods of hardware low utilization (e.g., sleep periods). Thus, in an IC with power-gating, there are two different supply nets: a VDD, which is always powered up; and a virtual VDD (hereinafter 'VDD_virtual'), which is powered down on some operation modes. VDD is connected to virtual VDD through a switch network.

During the sleep period the state of the IC is preserved by keeping some memories powered up. When the whole IC is to re-start operation, the virtual VDD has to be re-connected to VDD (typically 1.8V) to establish regular power supply voltage. If the wake-up process is not controlled, excessive transient currents can cause the VDD voltage to drop substantially—potentially corrupting the chip state—and damage the IC metal leads or transistors. Further, excessive transient currents may cause excessive noise, and the excessive noise coupling can also corrupt memories.

Various approaches to power-gating have been developed. In one approach, the switch network consists of many small switches and the transient current is controlled by turning on the small switches in delayed groups. Thus, at any given time, only a portion of the many switches are turned on and the transient current is reduced. FIG. 1 shows a typical switch network that comprises a plurality of switches SW1 to SWn, and digital circuits powered by the virtual VDD. The number of small switches can be as high as thousands in common integrated circuits. And as shown in FIG. 1, the switches are mixed with the regular digital circuitry.

In the prior art power-gating techniques such as FIG. 1, these switches need to be placed during a process called "digital implementation" when the digital design is translated from a high-level language, like Verilog, to actual digital gates. These switches make digital implementation much harder because it is hard to know in advance how many switches will be needed or how to distribute them across the circuit. Further, each switch or switch group must be able to cope with the local worst case of current consumption, and each switch has to support the whole VDD across their drain-to-source voltage, which has a severe reliability problem.

The reliability problem cannot be solved by using larger voltage devices because of the extra layout area required for the wells. One approach towards this problem is illustrated by FIG. 2. As shown in FIG. 2, during normal operations, switches 204.1 and 204.2 connect internal power supplies PGVDD and PGVSS to external power supplies VDD and VSS to provide power to a power-controlled circuit 202. During the standby mode, the internal power supplies PGVDD and PGVSS are connected by switches 204.3 and 204.4 to a voltage at the middle between the VDD and VSS power supplies. Accordingly, in standby operations, the voltage across the gate oxides of switches 204.1 and 204.2 is prevented from exceeding (VDD−VSS)/2 and breakdown is prevented. However, this method has a severe penalty in area, in-rush (voltage) drop and complexity.

Many switches spread out in the digital circuit also make it impossible to eliminate the presence of the switches using a Focused ion beam (FIB) or a simple metal edit. Further, because the switches are mixed with the regular logic, a full-width VDD lead is needed to carry the whole current from the cell outside to the switch and a wide track is also required for the VDD_virtual. This results in an area penalty compared to a regular circuit without power-gating. Moreover, digital implementation requires more iterations and often there is no digital flow or tools to help with this process. In addition, it is difficult to know when the digital circuit is finally ready for operation and the wake-up process completed. Also, in order to calculate the position and number of switches there is information that is needed from the digital circuitry. However, for some IP blocks this information might not be available.

Therefore, although power-gating is a technique able to deliver significant power savings, adding a complex switch network to implement the power-gating in the current technology is costly in terms of time and design resources. Accordingly, there is a need in the art for providing a power-gating switch circuit outside the digital circuitry.

DETAILED DESCRIPTION

The disadvantages of the prior art are overcome by a power-gating switch external to the digital circuit. The power-gating switch may comprise a plurality of switches that are turned on individually during different stages of a wake up process. In an initial stage, a high impedance switch may be turned on to control the in rush current. When the virtual power supply reaches a predetermined level, a low impedance switch may be turned on such that the power-gating switch may provide a large current during regular operations.

Figure 1:
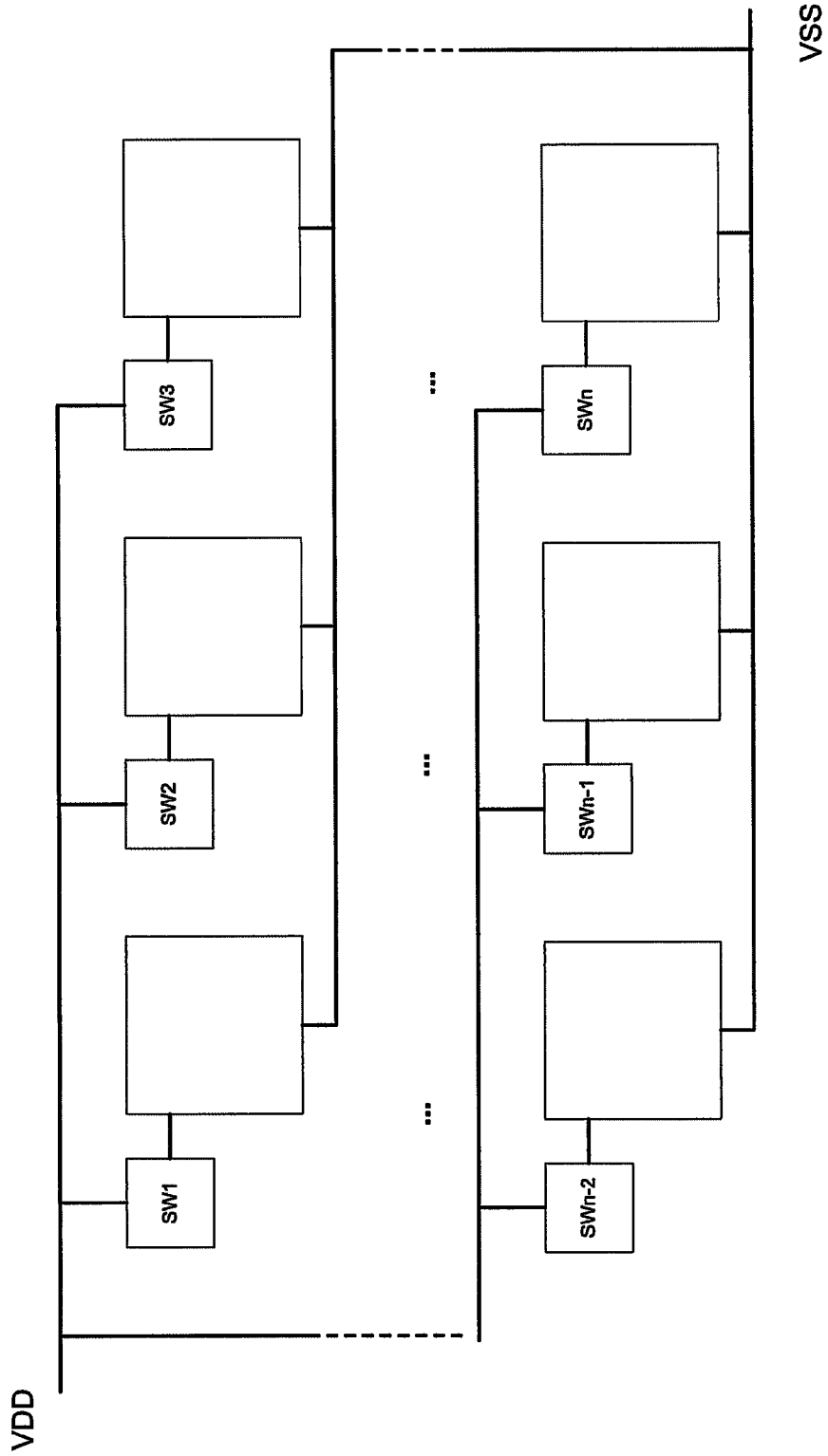
FIG. 1 illustrates a prior art approach to power-gating.
Figure 2:
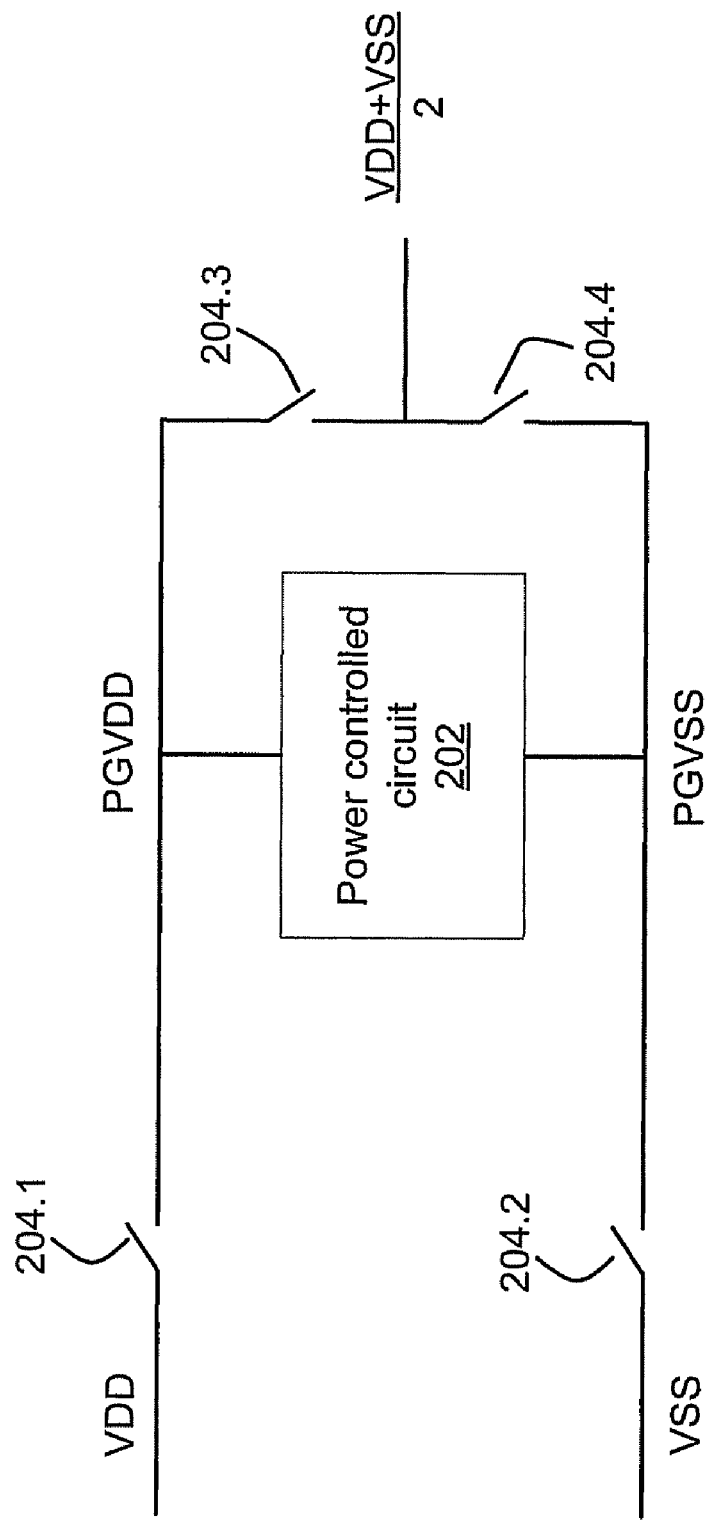
FIG. 2 illustrates a prior art solution to the reliability problem.
Figure 3:
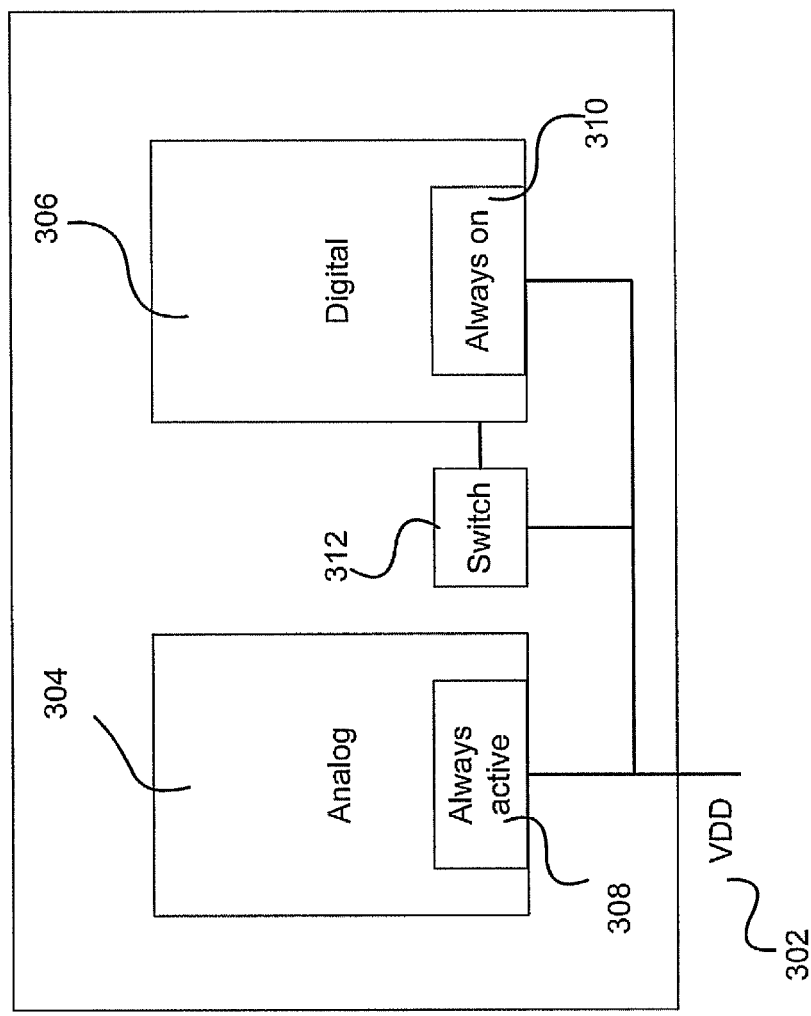
FIG. 3 illustrates a block diagram of an exemplary chip according to an embodiment of the present invention.

FIG. 3 is a block diagram of an integrated circuit (IC) chip 300 according to an embodiment of the present invention. The IC chip 300 may comprise a power supply VDD 302, an analog circuit 305, a digital circuit 306 and a power-gating switch 312. The analog circuit 305 may include an always active portion 308 and may be connected to the power supply VDD 302 via the always active portion 308. The digital circuit 306 may include an always on portion 310, which may be connected the power supply VDD 302 directly. The rest of the digital circuit 306 (other than the always on portion 310) may be connected to the power supply VDD 302 through the power-gating switch 312. That is, the rest of the digital circuit 306 may be powered by a virtual VDD, which may be referred to as a power rail for the digital circuit 306. The virtual VDD may be connected to the VDD 302 during normal operations and may be disconnected (e.g., 0 V) during a sleep mode. The always on portion 310 may comprise small digital blocks for administrative functions (e.g., wake up control signaling and other minimum control logic for the digital circuit 306.

In one embodiment, the analog circuit 304 may enter a standby mode when the digital circuit 306 enters the sleep mode. During the standby mode, the analog circuit 304 may be powered down to an analog VDD (e.g., 1.8V). The always active portion 308 of the analog circuit 304 may be always powered by the full VDD even during the standby mode. The always active portion 308 may comprise one or more of: low dropout regulator(s) (LDO), band gap voltage reference(s), and reset control logic (e.g., power-on reset (POR)).

In one embodiment, the current consumed by the chip 300 during a power-gated sleep mode may be less than 5 microampere (μA).

Figure 4:
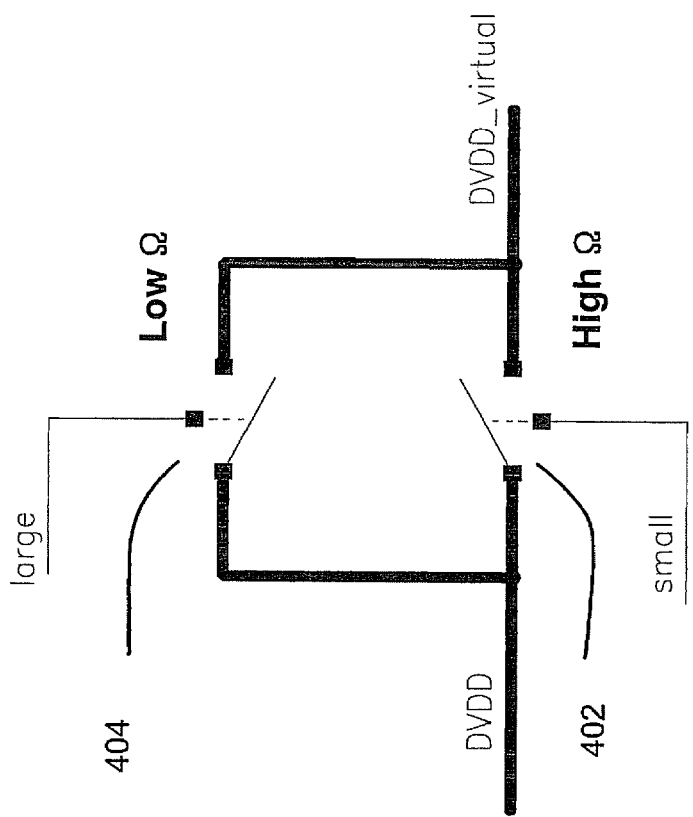
FIG. 4 illustrates a power-gating switch according to an embodiment of the present invention.

FIG. 4 illustrates a power-gating switch 400 according to an embodiment of the present invention. This power-gating switch 400 may include a first switch 402 and a second switch 404. The first and second switches 402 and 404 may be connected in parallel between a power supply DVDD and a virtual power supply DVDD_Virtual. In one embodiment, the first switch 402 may be a high impedance switch with respect to the second switch 404, which may be considered a low impedance switch. Both the first and second switches 402 and 404 may be disconnected when a circuit using the power-gating switch 400 enters a sleep mode. When a wake up process starts, the first switch 402 with a high impedance may be turned on first. Because of the high impedance, the current flowing through the first switch 402 may be limited to below a certain level. And thus, a momentary drop of the DVDD may be limited. When the wake up process has finished (e.g., the DVDD_Virtual rising high enough to reach a predetermined level), the second switch 404 with the low impedance may be turned on. Thus, during normal operations, a large current may be allowed to pass through from the DVDD to the DVDD_Virtual. Because only one power-gating switch 400 may be needed for an entire chip, area penalty for the chip may be negligible. Further, because the power-gating switch 400 may be external to any digital circuits, a designer need not worry the size and layout of standard cells of the digital circuit. Accordingly, there are few restrictions about the size and layout of the first and second switches 402 and 404 (e.g., width of the switch may be large enough to overcome any reliability issues).

In embodiments of the present invention, the impedance of the high or low impedance switches may be chosen based on number of active elements contained by the load circuit that need to be charged and/or the time need to complete start up. Also, the impedance of the high impedance switch may be determined based on the threshold level for the VDD (e.g., POR), below which a chip may reset. In addition, the impedance of the low impedance switch may be determined based on the current required for normal operations of the load circuit. In one embodiment, the high impedance switch may has an impedance of 1 kΩ and the low impedance switch may has an impedance of 400Ω.

Figure 5:
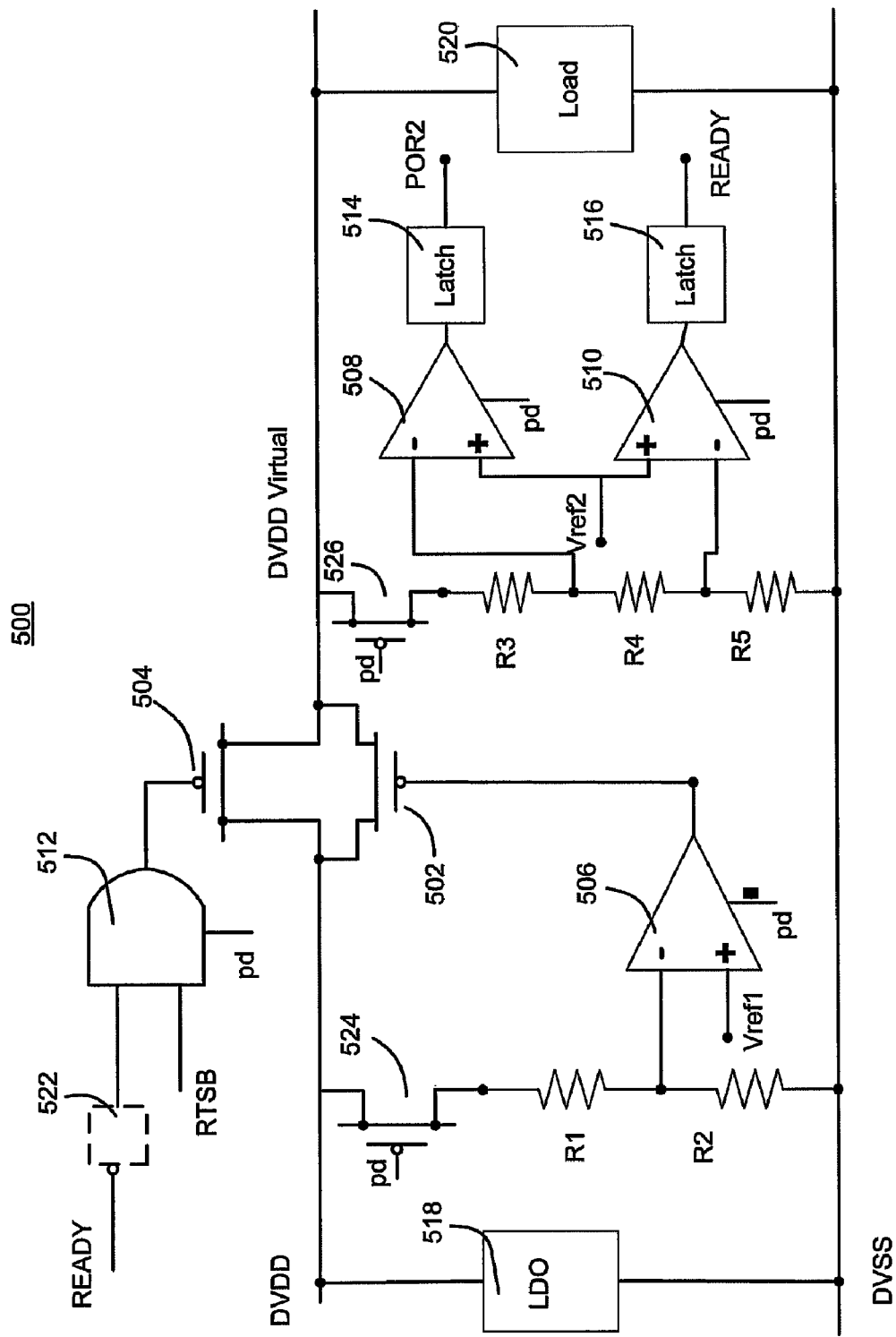
FIG. 5 illustrates a wake up control circuit according to an embodiment of the present invention.

FIG. 5 illustrates a power-gating switch circuit 500 according to an embodiment of the present invention. The power-gating switch circuit 500 may comprise two switches 502 and 504 connected in parallel between a power supply DVDD and a virtual power supply DVDD virtual. The charge current to the DVDD virtual may be regulated by a LDO 518 and the DVDD virtual may have a load 520. The switch 502 may be controlled by a comparator 506. The comparator 506 may have one input connected to a first resistor divider (shown as a resistor chain consisting of resistors R1 and R2 connected in series between the DVDD and DVSS) and another input connected to a reference voltage Vref1. The switch 504 may be controlled by an AND gate 512 that has one input of an invert READY signal and a RTSB reset signal, which may be the chip reset signal. In one embodiment, the READY signal may go through some other circuitry 522 before reaching the AND gate 512. The other circuitry 522 may provide additional controls or features.

The power-gating switch circuit 500 may further comprise comparators 508 and 510. The comparators 508 and 510 each has one input coupled to a second resistor divider (shown as resistors R3, R4 and R5 connected in series between the DVDD and DVSS) and another input coupled to a common reference voltage Vref2. As shown in FIG. 5, the comparator 508 may compare a voltage at the point between R3 and R4 to the reference voltage Vref2 and the comparator 510 may compare a voltage at the point between R4 and R5 to the reference voltage Vref2. The output of the comparator 508 may be used as a second power on reset signal (POR2) and the output of the comparator 510 may be used as the READY signal. In one embodiment, a latch 514 may be coupled to the comparator 508 and a latch 516 may be coupled to the comparator 510. Thus, the POR2 and READY signals may be the outputs of the latches 514 and 516, respectively.

The switch 502 may have a high impedance that may have a relatively small current when turned on. The switch 504 may have a low impedance that may have a relatively large current when turned on. When the power-gating switch circuit 500 enters a sleep mode (e.g., powered down), both switches 502 and 504 may be disconnected. The load 520 may have a leak current that constantly drains the electricity from the DVDD virtual and DVDD virtual may go to zero. During a wake up process, the comparator 506's output may keep the switch 502 on as long as the DVDD maintains near or higher than a minimum voltage level Vmin. In one embodiment, the switch 502 may be kept on as long as the voltage at the point between R1 and R2 is higher than the reference voltage Vref1, which may be determined based on the value of Vmin. For example, if the DVSS is ground, Vref1 may equal to Vmin×R2/(R1+R2). If the DVDD drops below the Vmin, the switch 502 may be turned off and the DVDD may be charged by the LDO 518 to be higher than Vmin again. The Vmin may be set above the power on reset (POR) level, and thus, considering a delay in triggering the comparator 506 and system error of the comparator 506, the DVDD may kept at a good level. In one embodiment, the LDO 518 may provide a charge current of about 8 milliampere (mA) and the leak current may be around 10 microampere (μA).

Further, during the wake up process, the rise of the DVDD virtual may be monitored by the two comparators 508 and 510. The comparator 508 may be triggered when the DVDD virtual rises high enough that the voltage at the point between the resistors R3 and R4 may reach the reference voltage Vref2. When the voltage at the point between the resistors R3 and R4 reaches the reference voltage Vref2, the POR2 signal may be triggered. In one embodiment, the POR2 may reset any flip flops in the digital circuit of a chip. When the DVDD virtual keeps rising, the comparator 510 may be triggered when the DVDD virtual rises high enough that the voltage at the point between the resistors R4 and R5 may reach the reference voltage Vref2. When the voltage at the point between the resistors R4 and R5 reaches the reference voltage Vref2, the READY signal may be triggered. In one embodiment, the READY signal may be used to turn on the low impedance switch 504 that provides a relatively large current compared to the switch 502. The latches 514 and 516 may prevent the POR2 and READY signals from unstable oscillation. In one embodiment, either of the latches may be reset on chip reset, wakeup start or DVDD going too low during wake up.

The power-gating switch circuit 500 may further comprise a power switch 524 for the first resistor divider (e.g., the resistor chain of R1 and R2) and a power switch 526 for the second resistor divider (e.g., the resistor chain of R3, R4 and R5). In one embodiment, the power-gating switch circuit 500 may further support a second sleep mode in addition to a first sleep mode of turning off the DVDD virtual. In this embodiment, the switches 502 and 504 may be controlled independently in addition to being controlled by the comparator 506 and AND gate 512. Further, the AND gate 512 and comparators 506, 508 and 510 may turned off by a power down signal pd. In the second sleep mode, the digital clocks (not shown) of the load 520 (e.g., rest of the digital circuit 306) may be stopped, the AND gate 512, comparators 506, 508 and 510, and the first and second resistor dividers may be turned off by the power down signal pd, but the switch 504 may be kept on.

In one embodiment, the resistor dividers may be adjustable (e.g., programmable) resistive elements. The resistors R1 and R2 may have values of kilo ohms (kΩ) and the resistors R3, R4 and R5 may have values of mega ohms (MSΩ).

In one embodiment, the comparators may have system errors, such as the there may be a range of ±2 mV for a comparator to trigger. Thus, of the three comparators 506, 508 and 510, the power-gating switch circuit 500 may have a maximum system error of ±6 mV. The comparators may also have a delay that may as long as 100 ns.

In one embodiment, the reference voltages Vref1 and Vref2 may be generated based on band gap reference voltages. In one embodiment, the reference voltages Vref1 and Vref2 may be may be the same reference voltage.

In one embodiment, an IC chip may have more than one power-gating switch circuit 500 as external switches.

Figure 6A:
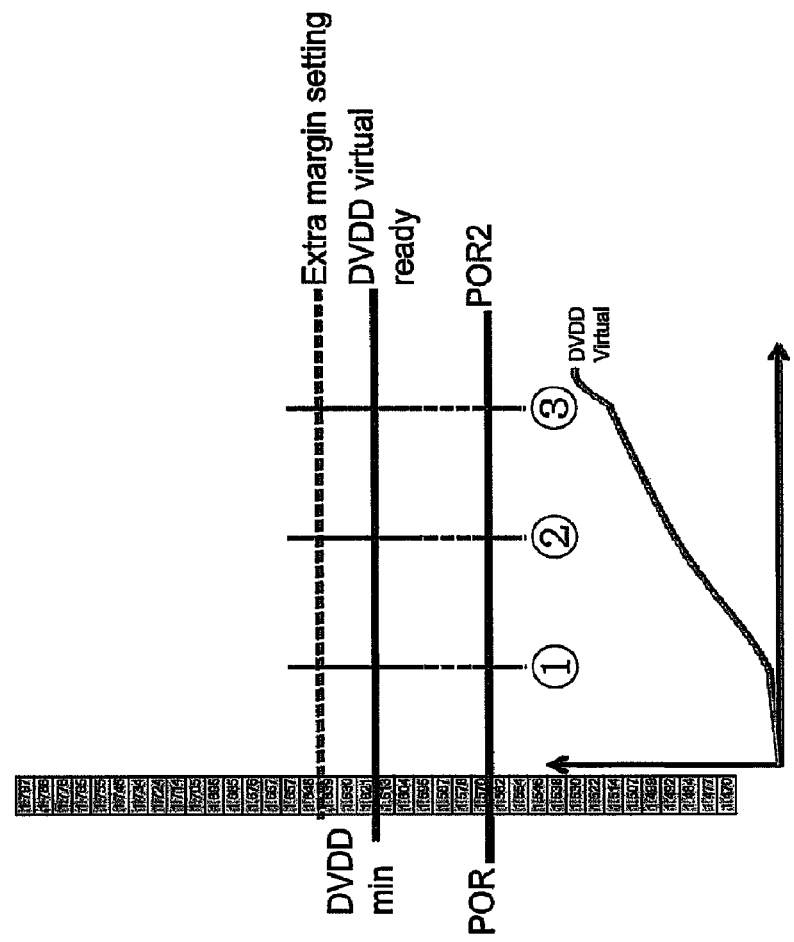
FIG. 6A illustrates simulated signals of a single current switch.

FIG. 6A illustrates simulated signals of a single current switch. The top diagram shows the power supply V, the middle diagram shows the virtual power supply V virtual and a reference voltage Vref2 and the bottom diagram shows the in rush current. As shown in FIG. 6A, when the single current switch turns on, the in rush current in the bottom diagram has a rapid increase to reach as high as above 60 mA, the power supply V of the top diagram momentarily drops from 1.6V to below 1.58V and the virtual power supply V virtual of the middle diagram stops increasing as the in rush current rises above certain level. As described above, the single current switch may suffer a big drop in the power supply V, which may trigger the POR and reset the chip. Further, the large in rush current may cause physical damages (e.g., damage to the transistors) and/or logic damages (e.g., corrupt the states).

Figure 6B:
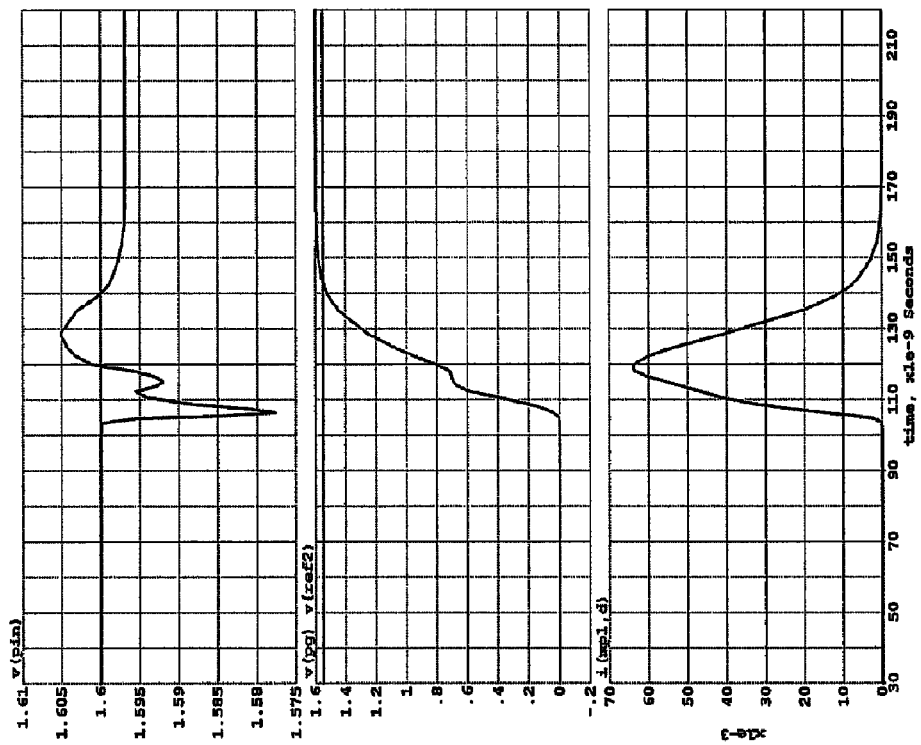
FIG. 6B illustrates a relationship among signals for a power-gating switch circuit for a chip according to an embodiment of the present invention.

FIG. 6B illustrates a relationship among signals for a power-gating switch circuit for a chip according to an embodiment of the present invention. In comparison to FIG. 6A, at point 1, at the start of the wake up process, only a small current switch may be turned on and a comparator (e.g., the comparator 506) may keep the DVDD above the POR. Further, at point 2, when the DVDD virtual rises above POR2, a reset signal may be issued. And then, at point 3, when the DVDD virtual crosses the READY signal, a large current switch may be turned on and the chip may enter regular operation.

Several embodiments of the present invention are specifically illustrated and described herein. However, it will be appreciated that modifications and variations of the present invention are covered by the above teachings and within the purview of the appended claims without departing from the spirit and intended scope of the invention.

It should be understood that there exist implementations of other variations and modifications of the invention and its various aspects, as may be readily apparent to those of ordinary skill in the art, and that the invention is not limited by specific embodiments described herein. Features and embodiments described above may be combined. It is therefore contemplated to cover any and all modifications, variations, combinations or equivalents that fall within the scope of the basic underlying principals disclosed and claimed herein.

I claim:

1. A power-gating switch circuit, comprising:
a first switch to connect a power supply to a power rail, and
a second switch to connect the power supply to the power rail in parallel to the first switch, the first switch having a higher impedance than the second switch, wherein the first switch is turned on first when a wake up signal is received and the second switch is turned on after the power rail reaches a predetermined voltage level.

2. The power-gating switch circuit of claim 1, further comprising a first comparator that keeps the power supply above a reset threshold.

3. The power-gating switch circuit of claim 2, wherein the first comparator has one input coupled to a first resistor divider for the power supply and another input coupled to a first reference voltage.

4. The power-gating switch circuit of claim 3, further comprising a second resistor divider for the power rail and a second comparator with two inputs coupled to a first point of the second resistor divider and a second reference voltage respectively, wherein whether the power rail reaches the predetermined voltage level is determined by second comparator.

5. The power-gating switch circuit of claim 4, wherein the output of the second comparator is coupled to a latch.

6. The power-gating switch circuit of claim 5, further comprising a third comparator coupled to a second point of the second resistor divider and the second reference voltage, wherein the output of the third comparator is a reset signal that resets flip flops.

7. The power-gating switch circuit of claim 6, wherein a first sleep mode is provided by turning off the first and second switches and a second sleep mode is provided by keeping at least the first switch on but turning off all comparators and resistor dividers.

8. A memory chip, comprising:
an analog circuit;
a digital circuit;
a power-gating switch circuit to provide a power rail to the digital circuit, comprising:
a first switch to connect a power supply to the power rail, and
a second switch to connect the power supply to the power rail, the first switch having a higher impedance than the second switch, wherein the first switch is turned on first when a wake up signal is received and the second switch is turned on after the power rail reaches a predetermined voltage level.

9. The memory chip of claim 8, wherein the digital circuit has an always on portion that is powered by the power supply during a sleep mode, the always on portion includes small digital blocks for administrative functions.

10. The memory chip of claim 8, wherein the analog circuit has an always active portion that is powered by the power supply during a sleep mode, the always active portion includes a low drop out (LDO), a band gap reference voltage and reset control logic.

11. The memory chip of claim 8, further comprising a first comparator that keeps the power supply above a reset threshold, wherein the first comparator has one input coupled to a first resistor divider for the power supply and another input coupled to a first reference voltage.

12. The memory chip of claim 11, further comprising a second resistor divider for the power rail and a second comparator with two inputs coupled to a first point of the second resistor divider and a second reference voltage respectively, wherein whether the power rail reaches the predetermined voltage level is determined by second comparator.

13. The memory chip of claim 12, wherein the output of the second comparator is coupled to a latch.

14. The memory chip of claim 13, further comprising a third comparator coupled to a second point of the second resistor divider and the second reference voltage, wherein the output of the third comparator is a reset signal that resets flip flops.

15. The memory chip of claim 13, wherein a first sleep mode is provided by turning off the first and second switches and a second sleep mode is provided by keeping at least the first switch on but turning off all comparators and resistor dividers.

16. A method to wake up a digital circuit in a powered down sleep mode, comprising:
in response to a wake up signal, turning on a first switch between a power supply and a power rail to provide a first charge current from the power supply to power up the power rail;
monitoring the power rail; and
turning on a second switch between the power supply and the power rail when the power rail reaches a predetermined voltage level, the first switch having a higher impedance compared to the second switch.

17. The method of claim 16, further comprising a first comparator that keeps the power supply above a reset threshold, the first comparator has one input coupled to a first resistor divider for the power supply and another input coupled to a first reference voltage.

18. The method of claim 17, further comprising a second resistor divider for the power rail and a second comparator coupled to a first point of the second resistor divider and a second reference voltage, wherein whether the power rail reaches the predetermined voltage level is determined by second comparator.

19. The method of claim 18, wherein the output of the second comparator is coupled to a latch.

20. The method of claim 19, further comprising a third comparator coupled to a second point of the second resistor divider and the second reference voltage, wherein the output of the third comparator is a reset signal that resets flip flops.

21. The method of claim 20, wherein a charge current for the power supply is provided by a low dropout regulator (LDO), and the charge current is as high as 8 mA.

22. A method to wake up a memory chip in a powered down sleep mode, comprising:
on response to a sleep signal, disconnecting a power rail that supplies power to a digital circuit of the memory chip;
in response to a wake up signal, turning on a high impedance switch to provide a charge current to power up the power rail;
monitoring the power rail; and
turning on a low impedance switch to connect the power rail to a power supply when the power rail reaches a predetermined voltage level.

23. The method of claim 22, wherein the digital circuit has an always on portion that is powered by the power supply during a sleep mode, the always on portion includes small digital blocks for administrative functions.

24. The method of claim 22, wherein the analog circuit has an always active portion that is powered by the power supply during a sleep mode, the always active portion includes a low drop out (LDO), a band gap reference voltage and reset control logic.

25. The method of claim 22, further comprising a first comparator that keeps the power supply above a reset threshold, wherein the first comparator has one input coupled to a first resistor divider for the power supply and another input coupled to a first reference voltage.

26. The method of claim 25, further comprising a second resistor divider for the power rail and a second comparator with two inputs coupled to a first point of the second resistor divider and a second reference voltage respectively, wherein whether the power rail reaches the predetermined voltage level is determined by second comparator.

27. The method of claim 26, wherein the output of the second comparator is coupled to a latch.

28. The method of claim 27, further comprising a third comparator coupled to a second point of the second resistor divider and the second reference voltage, wherein the output of the third comparator is a reset signal that resets flip flops.

29. The method of claim 22, wherein a charge current for the power supply is provided by a low dropout regulator (LDO), and the charge current is as high as 8 mA.

* * * * *